(12) United States Patent
Höpfner

(10) Patent No.: US 6,316,275 B2
(45) Date of Patent: Nov. 13, 2001

(54) METHOD FOR FABRICATING A SEMICONDUCTOR COMPONENT

(75) Inventor: Joachim Höpfner, Planegg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/793,351

(22) Filed: Feb. 26, 2001

(30) Foreign Application Priority Data

Feb. 25, 2000 (DE) .............................. 100 10 284

(51) Int. Cl.⁷ ...................................... H01G 7/06
(52) U.S. Cl. .............. 438/3; 438/238; 438/253; 438/776; 438/627
(58) Field of Search ............... 438/3, 238–241, 438/250–256, 381, 393–399, 766, 775–777, 783, 627

(56) References Cited

U.S. PATENT DOCUMENTS 5,523,595  6/1996  Takenaka et al. .
6,008,103  12/1999 Hoepfner .
6,048,764  4/2000  Suzuki et al. .
6,225,656  * 5/2001 Cuchiaro et al. ................ 257/295

FOREIGN PATENT DOCUMENTS 0 847 079 A2  6/1998  (EP) .
9-219 498     8/1997  (JP) .

* cited by examiner

Primary Examiner—Jey Tsai
(74) Attorney, Agent, or Firm—Herbert L. Lerner; Laurence A. Greenberg; Werner H. Stemer

(57) ABSTRACT

In a method for fabricating a semiconductor component, a first oxide layer is produced above a substrate. A capacitor is formed above the first oxide layer. The capacitor includes a bottom electrode and a top electrode and a metal-oxide-containing capacitor material layer deposited in between the electrodes. Prior to forming the capacitor, a plasma doping method is used to dope the first oxide layer with a barrier substance which builds up a hydrogen diffusion barrier in the first oxide layer.

18 Claims, 3 Drawing Sheets

METHOD FOR FABRICATING A SEMICONDUCTOR COMPONENT

BACKGROUND OF THE INVENTION

Field of the Invention

The invention relates to a method for fabricating a semiconductor component having a first oxide layer above a substrate and a capacitor formed above the first oxide layer, in which the capacitor has a metal-oxide-containing capacitor material layer deposited between a bottom electrode and a top electrode.

Conventional microelectronic semiconductor memory components for example, Dynamic Random Access Memories (DRAMs) essentially include a switching transistor and a storage capacitor. In this case, the stored information is represented by the charge state of the storage capacitor. Because of discharge processes, the charge state of a (volatile) DRAM memory cell must be continually renewed.

Oxide or nitride layers having a dielectric constant of at most about 8 are usually used as capacitor dielectrics in DRAMs. In order to reduce the size of the storage capacitor and in order to fabricate non volatile memories, "novel", metal-oxide-containing capacitor materials (paraelectrics or ferroelectrics) with significantly higher dielectric constants are required. Known examples of ferroelectric capacitor materials are $SrBi_2(Ta,Nb)_2O_9$ (SBT or SBTN), $Pb(Zr,Ti)O_3$ (PZT), $Bi_4Ti_3O_{12}$ (BTO), and a known example of a paraelectric high-epsilon capacitor material is $(Ba,Sr)TiO_3$ (BST).

The use of these novel capacitor materials poses technological difficulties. First, these novel materials can no longer be combined with polycrystalline silicon, the traditional electrode material. Therefore, it is necessary to use inert electrode materials such as, for example, platinum (Pt) or conductive metal oxides (e.g. $RuO_2$). The reason for this is that, after deposition, the novel capacitor materials have to be thermally treated ("conditioned"), if appropriate, a number of times in an oxygen-containing atmosphere at temperatures of about 550–800° C., and only the aforementioned inert electrode materials have a sufficient thermostability to avoid an undesirable chemical reaction between the electrode material and the capacitor material.

A further difficulty in the fabrication of such storage capacitors stems from the fact that metal-oxide-containing capacitor materials generally have a high sensitivity to hydrogen. However, after the formation of the storage capacitor, it is necessary to carry out process steps which take place in a hydrogen-containing environment. The disadvantage here is that the Pt electrodes are permeable to hydrogen and do not, therefore, form effective protection against hydrogen damage to the capacitor material.

In principle, there are various possibilities for solving the last-mentioned problem. From the standpoint of materials technology, attempts can be made to find an electrode material which is not permeable to hydrogen, or to find a dielectric material which is not sensitive to hydrogen. In terms of method technology, attempts can be made to avoid, after the formation of the storage capacitor, any process steps which proceed in a hydrogen-containing environment. In all of these solution variants, however, further serious difficulties arise in practice.

In the prior art, attempts have already been made to solve the problem by depositing a hydrogen barrier layer on the storage capacitor. U.S. Pat. No. 5,523,595, which is believed to be the most relevant prior art, describes a method for fabricating a semiconductor component with a ferroelectric storage capacitor. After the construction of the storage capacitor, a hydrogen barrier layer including TiON is produced above the capacitor by a chemical vapor deposition (CVD) process. The barrier layer prevents the penetration of hydrogen through the top Pt electrode of the storage capacitor. The disadvantage, however, is that hydrogen can still penetrate through the bottom Pt electrode and hydrogen can still penetrate laterally into the ferroelectric. Therefore, complete protection of the capacitor ferroelectric against degradation by hydrogen is not given.

SUMMARY OF THE INVENTION

It is accordingly an object of the invention to provide a method for fabricating a semiconductor component having a storage capacitor with a ferroelectric or paraelectric capacitor material which overcomes the above-mentioned disadvantageous of the prior art apparatus and methods of this general type. In particular, it is an object to provide a method for fabricating a semiconductor component in which the ferroelectric or paraelectric capacitor material of the storage capacitor is adequately protected against the penetration of hydrogen.

With the foregoing and other objects in view there is provided, in accordance with the invention a method for fabricating a semiconductor component, that includes: providing a substrate; producing a first oxide layer above the substrate; with a plasma doping method, doping the first oxide layer with a barrier substance to form a hydrogen diffusion barrier in the first oxide layer; subsequent to performing the plasma doping method, producing a capacitor above the first oxide layer; and producing the capacitor to include a bottom electrode, a top electrode, and a metal-oxide-containing capacitor material layer deposited between the bottom electrode and the top electrode.

With the foregoing and other objects in view there is also provided, in accordance with the invention a method for fabricating a semiconductor component, that includes: providing a substrate; producing a first insulation layer above the substrate; producing a capacitor above the first insulation layer; producing the capacitor to include a bottom electrode, a top electrode, and a metal-oxide-containing capacitor material layer deposited between the bottom electrode and the top electrode; producing an oxide layer above the capacitor; and with a plasma doping method, doping the oxide layer above the capacitor with a barrier substance to form a hydrogen diffusion barrier in the oxide layer.

An essential standpoint of the invention is that, in order to afford protection against the penetration of hydrogen into the capacitor material, an oxide layer is doped with a barrier substance. By virtue of the barrier substance atoms that are introduced into the oxide layer, the doped oxide layer is made impermeable to hydrogen to the greatest possible extent.

In this case, therefore, the term "doping" does not mean the introduction of impurity atoms in order to alter the conductivity (so-called p- or n-doping) but rather the introduction of impurity atoms in order to reduce the diffusibility of hydrogen (in an oxide layer).

According to a first aspect of the invention, a (first) doped oxide layer is formed below the capacitor. Another possibility consists in depositing a thin (second) oxide layer above the capacitor and doping it—at least in sections.

These two aspects of the invention can be combined with one another. In this case, one method variant is characterized in that the first doped oxide layer and the second doped oxide layer enclose the capacitor on all sides.

In accordance with an added feature of the invention, the barrier substance is preferably nitrogen. In this case, the doping results in nitriding of the first or second oxide layer. In general, however, it is also possible to use other suitable substances, e.g. noble gases, as the barrier substance.

In accordance with an additional feature of the invention, the doping (or nitriding) of the oxide layers is effected with the aid of a plasma discharge containing the barrier substance. The plasma discharge makes it possible for a sufficiently high barrier substance concentration to be produced in the first and/or second oxide layer in a short time (for instance 60 s), without exceeding a maximum substrate temperature in the range of 50–120° C. in the process. The plasma doping is therefore compatible with conventional photoresist masking techniques. Accordingly, an advantageous method sequence is characterized in that, prior to the plasma doping, a mask is applied on the first and/or second oxide layer, which mask is used to pattern the doping of the oxide layer; and in that an oxide etching step is subsequently carried out. The effect thereby achieved is that during the oxide etching step, it is still the case (i.e. as in the conventional case without a hydrogen barrier) that only oxide layer regions have to be etched. In contrast, if e.g. a TiON barrier layer were used, it would be necessary to use alternative etching procedures for removing the layer region by region (in order to avoid this, in U.S. Pat. No. 5,523,595, this layer is configured above the upper connection plane, which in turn means that its effectiveness is reduced). If sandwich layers (e.g. nitride/oxide multiple layers) were used, the changing layer composition would result in the occurrence of undercuts and/or overhangs in the region of the layer transitions, which have a pronounced disturbing effect during subsequent process steps (e.g. the filling of an etched-out contact hole).

In accordance with another feature of the invention, in the case of the discussed oxide etching of a contact hole using a previously applied (resist) mask, an advantageous method variant is characterized in that the structure created is exposed once more to plasma doping with a barrier substance. The walls of the contact hole are doped (e.g. nitrided) during this process. The advantage of this measure is that no hydrogen can pass through the walls of the contact hole and diffuse toward the capacitor material. This is important because it is precisely during the subsequent process of filling the contact hole, for example with tungsten (W), that relatively large quantities of hydrogen are liberated.

In accordance with a concomitant feature of the invention, the plasma doping can expediently be brought about either by means of a PIII (plasma immersion ion implantation) method or by means of a PLAD (so-called plasma doping) method. Both of the methods mentioned enable the targeted setting of an isotropic ("plasma cloud") and an anisotropic ("ballistic implantation") doping component as a function of the method parameters chosen. By increasing the isotropic doping component, it is possible, for example, for even irregular surface topologies (e.g. trenches, holes, etc.) to be doped uniformly.

Other features which are considered as characteristic for the invention are set forth in the appended claims.

Although the invention is illustrated and described herein as embodied in a method for fabricating a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
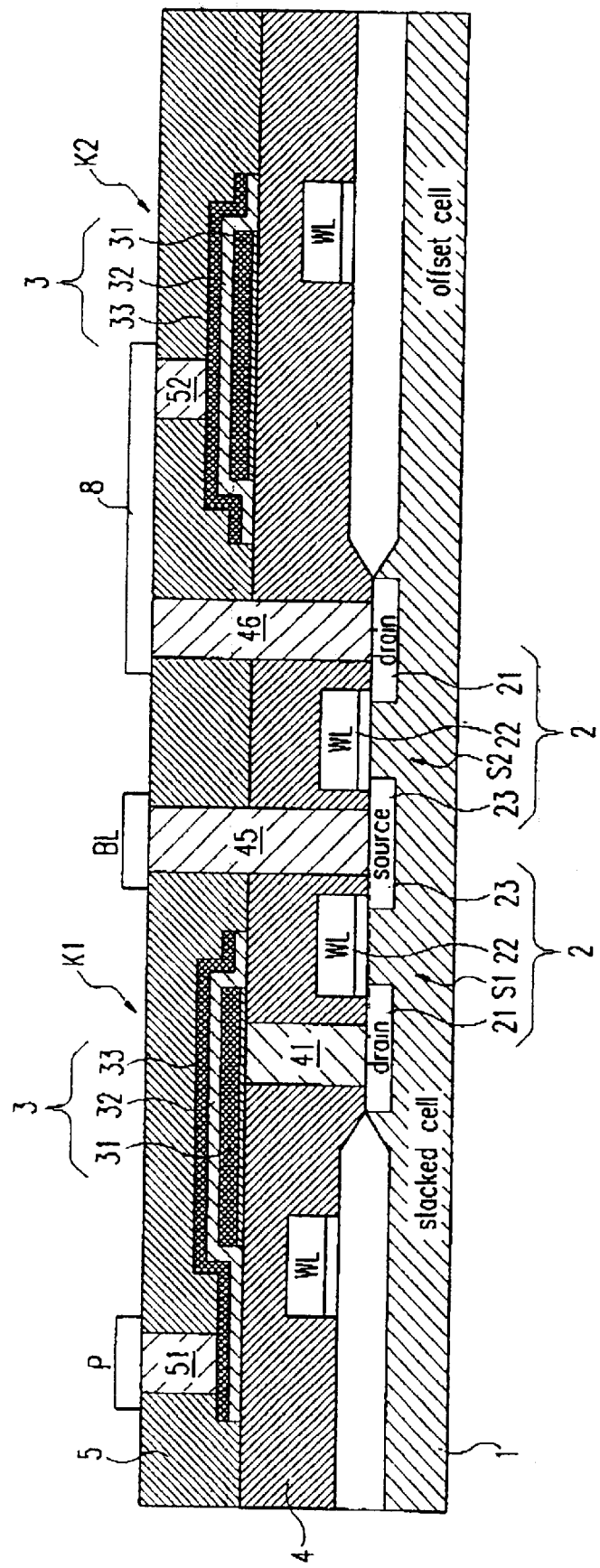
FIG. 1 shows a cross-sectional view illustrating two structural configurations used for memory cells which are known in the prior art.

Referring now to the figures of the drawing in detail and first, particularly, to FIG. 1 thereof, there is shown two known structural concepts for memory cells. The method according to the invention can be employed in each of the concepts. What is common to both structural concepts is that a switching transistor S1, S2 is formed in a lower plane directly on a semiconductor substrate 1 and a storage capacitor K1, K2 is configured in an upper plane. The two planes are isolated from one another by an intervening insulation layer 4.

In accordance with the first structural concept ("stacked cell"), the switching transistor S1 and the storage capacitor K1 are essentially configured directly above one another. The bottom electrode 31 of the storage capacitor S1 is electrically connected to a drain region 21 of the MOS transistor S1 (the components of the transistor are also designated by reference numeral 2) through the insulation layer 4 via a contact hole 41 ("plug") filled with a conductive material.

In accordance with the second structural concept ("offset cell"), the switching transistor S2 and the storage capacitor K2 are configured offset from one another. The top electrode 33 of the storage capacitor K2 is electrically connected to the drain region 21 of the MOS transistor S2 (the components of the transistor are also designated by reference numeral 2) through two contact holes.

In FIG. 1, both structural concepts are shown combined in a single component merely in order to simplify the illustration.

The component structure and the way in which it is fabricated are explained in more detail below with reference to the "stacked cell". However, the description can for the most part be applied to the "offset cell". Comparable components of the "offset cell" are therefore identified by the same reference symbols.

First of all, the MOS transistor 2 already mentioned is fabricated on a semiconductor substrate 1 as follows: an n- or p-doping is carried out to form the drain region 21 and a source region 23, between which there is a channel whose conductivity can be controlled by a gate 22 configured above the channel. The gate 22 may be formed by, or connected to, a word line WL of the memory component. The source region 23 is connected to a bit line BL of the memory component.

The MOS transistor 2 is subsequently covered with the planarizing insulation layer, for example a first oxide layer 4.

A storage capacitor 3 is formed on the first oxide layer 4. For this purpose, first of all the contact hole 41 is etched into the first oxide layer 4 and filled with a conductive material, for example polycrystalline silicon. The bottom electrode 31 is then applied above the filled contact hole 41 (possibly isolated from the "plug" by a barrier layer (not illustrated)).

A dielectric layer 32 of a ferroelectric or paraelectric material is deposited onto the bottom electrode 31, for example by metalorganic chemical vapor deposition (MOCVD) or by a sputtering method. The dielectric layer 32 forms the capacitor dielectric. A top electrode 33 is deposited over the whole area above the dielectric layer 32. The resulting structure is finally covered with a further planarizing insulation layer 5, for example likewise including $SiO_2$.

A further contact hole 51 is formed in the upper insulation layer 5, through which hole the top electrode 33 of the storage capacitor 3 can be connected to an external electrical connection p (common capacitor plate) by a suitable conductive material.

Finally, the source region 23 of the MOS transistor 2 is connected to the bit line BL as follows: a contact hole 45 extending through both insulation layers 4 and 5 is formed and filled with a conductive material.

In the case of the "offset cell" structure illustrated in the right-hand part of FIG. 1, a contact hole 46 comparable to the contact hole 45 is formed in order to connect the drain region 21 of the MOS transistor S2 to the top electrode 33 of the storage capacitor k2, 3 by a conductive cross-connection 8 and a further contact hole 52 extending through the upper insulation layer 5.

In both structural concepts, then, it is necessary to fill a plurality of contact holes 41, 51, 45, 46, 52 with an electrically conductive contact hole material. In particular in the case of relatively small feature sizes, tungsten (W) deposited in a CVD process is eminently suitable as contact hole material. In this case, however, the problem arises that the tungsten (W) deposition in the CVD (chemical vapor deposition) process proceeds in a hydrogen-containing atmosphere. The hydrogen can penetrate through the platinum (Pt) top and bottom electrodes 31, 33 and damage to the capacitor material 32 may occur because of the catalytic properties of the platinum.

If e.g. SBT is used as the ferroelectric capacitor material, the reduction of $BiO_x$ results in damage to this material. For other metal-oxide-containing capacitor materials, there are analogous damage mechanisms which are likewise attributable to the penetration of hydrogen and the catalytic action of platinum (Pt) (or other inert electrode materials).

The way in which penetration of hydrogen into the dielectric layer 32 forming the capacitor dielectric can be prevented by the invention's method of plasma-enhanced doping of one or more oxide layers is explained below with reference to FIGS. 2A to 2E, using the example of the "offset cell". In order to simplify the explanation, the barrier substance is assumed to be nitrogen and method steps which have already been explained in connection with the prior art illustrated in FIG. 1 are partly omitted.

Figure 2A:
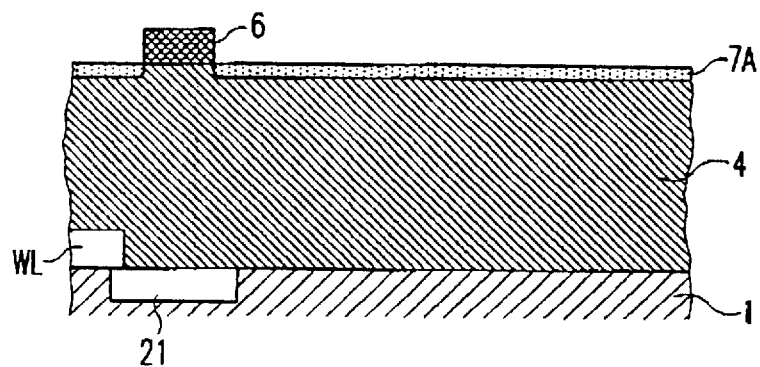
FIGS. 2A to 2E show cross-sectional views, at different stages of fabrication, of a semiconductor component with an offset memory cell configuration.

After the completion of the switching transistor S2 (the word line WL and the drain region 21 of the transistor are illustrated in FIGS. 2A to 2E), in accordance with FIG. 2A, first of all the first oxide layer 4 is deposited by customary techniques in the manner already explained with reference to FIG. 1. In order to form a planar surface, the oxide layer 4 is subsequently planarized by CMP (chemical mechanical polishing).

In a subsequent step, the oxide layer 4 is coated with a resist mask layer, which is then patterned photolithographically, for example. In this case, care is taken to ensure that a mask structure 6 remains at that location at which the contact hole 46 is to be subsequently formed.

The low-temperature nitriding step according to the invention is thereupon carried out. The nitriding step takes place at a substrate temperature of from 50° C. to at most 120° C. and is therefore compatible with the photomask technology used. The plasma nitriding has the effect that nitrogen atoms are incorporated in the first oxide layer 4 outside the mask structure 6 in a region near the surface. The nitrided surface region of the first oxide layer 4 thus created is designated by the reference symbol 7A.

Whereas in the "stacked cell" concept, it is the case that first the contact hole 41 is formed, filled and provided with a barrier layer, and then the storage capacitor K1 is realized above it, in the exemplary embodiment of the "offset cell" concept presented here, it is now the case, that the storage capacitor K2 is constructed immediately. For this purpose, first of all the bottom Pt electrode 31 is applied on the nitrided surface region 7A of the first oxide layer 4 (See FIG. 2B). The dielectric, in particular paraelectric or ferroelectric, layer 32, including, for example, BST or other suitable materials such as e.g. SBTN, PZT, BTO, etc., is then deposited.

Afterward, the top Pt electrode 33 is deposited onto the dielectric layer 32 and patterned together with the dielectric layer 32 by photolithography and etching technology. The dielectric layer 32 and the top Pt electrode 33 are preferably deposited and patterned in such a way that both layers extend beyond the bottom electrode 31 at least on one side thereof in the lateral direction and are present in the form of a step on the bottom electrode 31. The step region enlarges the effective capacitor area.

This structure is then coated with a thin second oxide layer including e.g. $SiO_2$.

Afterward photoresist mask structures 9.1 and 9.2 are produced lithographically on the second oxide layer at suitable locations. The mask structure 9.2 is preferably provided centrally above the storage capacitor K2. The mask structure 9.1 covers a region of the second oxide layer which lies directly above the non-nitrided region of the first nitrided oxide layer 7A.

Figure 2B:
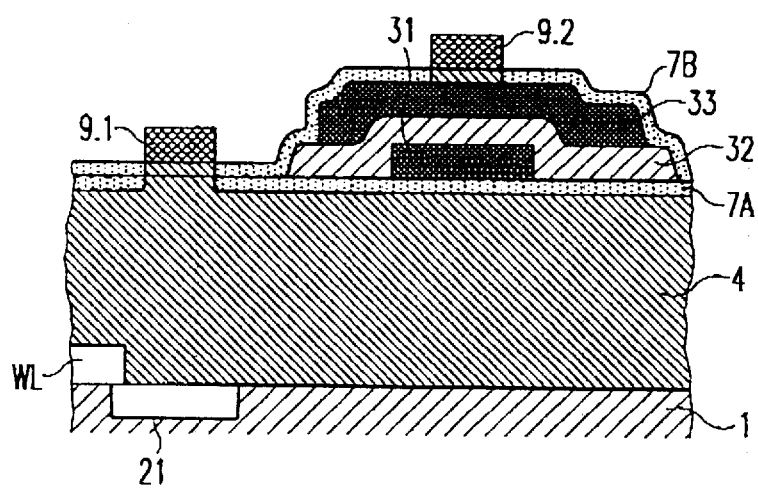

The thin second oxide layer is then likewise subjected to plasma nitriding. Depending on the layer thickness of the second oxide layer and the method parameters used during the nitriding, the layer is nitrided in its entire thickness or merely in a region near the surface. In this case, the nitrided second oxide layer 7B shown in FIG. 2B is formed, which continues to include non-nitrided oxide material underneath the photoresist mask structures 9.1 and 9.2.

Figure 2C:
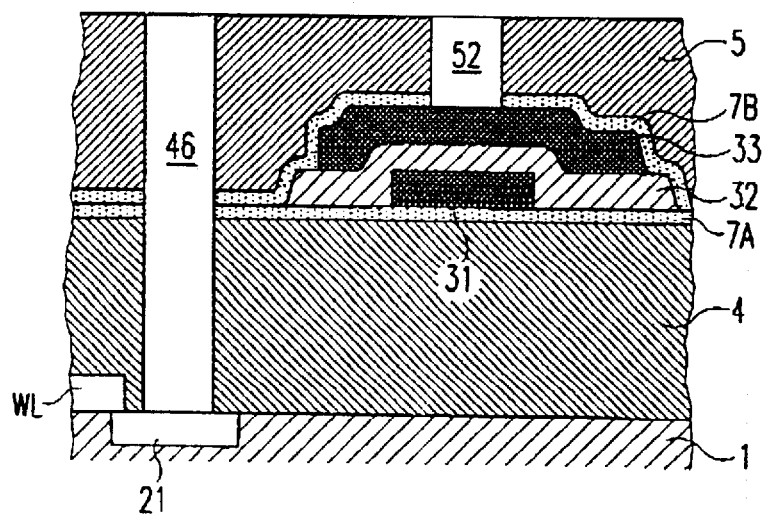

The planarizing upper insulation layer 5, preferably likewise an $SiO_2$ layer, is then deposited above the structure described (See FIG. 2C). In this process, which may be carried out with the participation of hydrogen, the capacitor 3 is already protected by the second nitrided oxide layer 7B.

Afterward, the two contact holes 46 and 52 are etched. Because of the patterning of the nitrided oxide layers 7A and 7B which is produced by the masking 6, 9.1 and 9.2, both contact holes 46 and 52 can be formed by customary oxide etching. Etching of different layer materials is not necessary. Consequently, the contact holes 46 and 52 have pronounced dimensionally accurate and planar inner wall surfaces, thereby promoting lateral structural size reduction. The contact holes 46, 52 can be formed jointly in a single etching step or else in two individual etching steps.

Figure 2D:
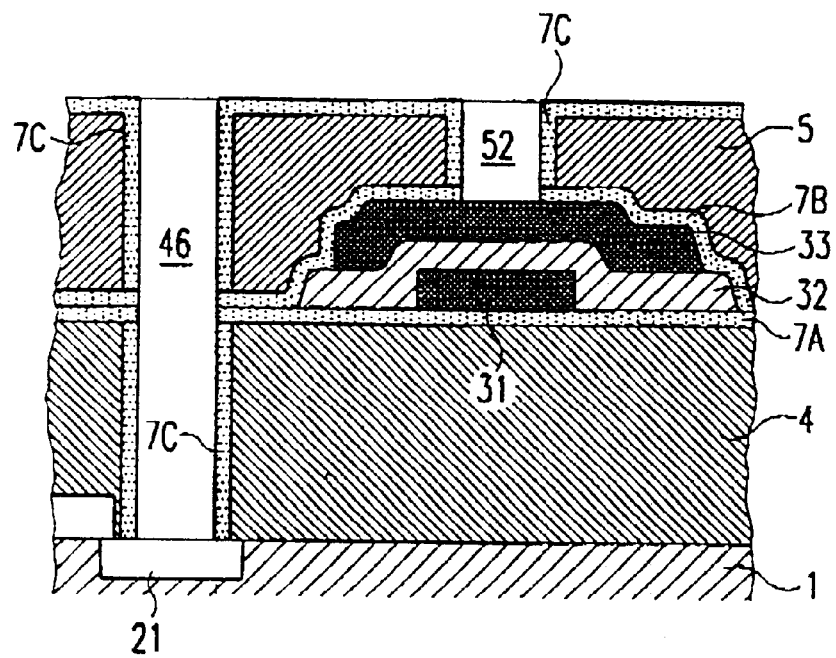

In accordance with FIG. 2D, a third plasma nitriding step can now be carried out. In this case, near-surface inner wall surface regions 7C of the two contact holes 46 and 52 and also a surface region of the upper oxide layer 5 are nitrided.

The contact holes 46 and 52 are then filled with a suitable conductive material, for example tungsten (W), in the manner already described. Afterward, in a manner not illustrated, a CMP step may be carried out in order to produce a planar surface.

Figure 2E:
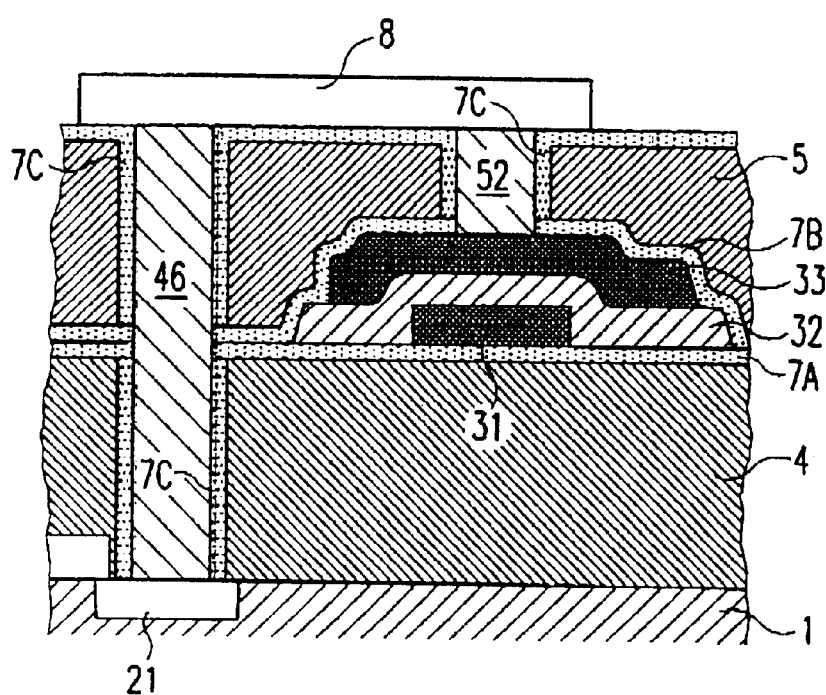

Finally, an electrical connection between the drain region 21 and the top capacitor electrode 33 is established by the production of the conductive cross-connection 8 above the two contact holes 46 and 52 (See FIG. 2E).

Two possibilities for nitriding the different oxide layers in nitrogen plasma are described below. Both methods are known in connection with the n- or p-doping of silicon with suitable dopants.

The PIII method is usually carried out in an installation including two chambers. A continuously burning nitrogen plasma having a high plasma density is produced in one chamber. A magnetic field may be used to control the plasma density.

The substrate with the oxide layers to be nitrided is situated in the other chamber. The two chambers are connected to one another by a perforated screen. A voltage is then applied to the substrate for a short time, as a result of which nitrogen ions are extracted from the plasma, accelerated through the perforated screen toward the substrate 1 and stopped in the respectively exposed oxide layer.

The degree of anisotropy of the nitriding can be influenced to a great extent by the setting of the plasma and extraction conditions. At a high extraction voltage, anisotropic ion implantation occurs. The effect that can be achieved e.g. by decreasing the extraction voltage, increasing the plasma density and also by changing the geometrical ratios is that the nitriding is brought about by an extended "plasma cloud". In this case, uniform nitriding of the oxide layers can be achieved even in the case of irregular surface topologies, and it has been shown that contact holes having an aperture ratio of up to about 1:12 can be nitrided to their full length without difficulty.

The PLAD method is usually carried out in a single plasma chamber. The installation is constructed similarly to a sputtering installation. A high-frequency voltage is applied between two electrodes and a nitrogen plasma is ignited. The substrate is situated on that electrode toward which the nitrogen ions are accelerated. The system operates analogously to a sputtering installation that has undergone polarity reversal.

In the case of the PLAD method, too, the degree of anisotropy of the nitriding can be set as desired by way of the installation geometry and the configuration of the nitrogen plasma.

With both methods it is possible to set a typical nitriding dose in the range from $10^{19}$ to $10^{22}$ atoms/cm$^2$. Typical nitriding energies (kinetic energy of the accelerated nitrogen ions when impinging on the oxide layers) lie in the range from 1 to 12 keV. In both methods, furthermore, it is possible to progressively build up a desired thickness of the nitrided oxide layer region by changing the nitriding energy during the nitriding step. The nitriding process then begins at the highest nitriding energy and ends at the lowest nitriding energy. The duration of the entire nitriding step is typically about 60 seconds given a nitriding dose of $10^{20}$ atoms/cm$^2$.

I claim:

1. A method for fabricating a semiconductor component, which comprises:
   providing a substrate;
   producing a first oxide layer above the substrate;
   with a plasma doping method, doping the first oxide layer with a barrier substance to form a hydrogen diffusion barrier in the first oxide layer;
   subsequent to performing the plasma doping method, producing a capacitor above the first oxide layer; and
   producing the capacitor to include a bottom electrode, a top electrode, and a metal-oxide-containing capacitor material layer deposited between the bottom electrode and the top electrode.

2. The method according to claim 1, which comprises:
   producing an oxide layer above the capacitor, the oxide layer above the capacitor defining a second oxide layer;
   with a plasma doping method, doping the second oxide layer with a barrier substance to form a hydrogen diffusion barrier in the second oxide layer; and
   ensuring that the hydrogen diffusion barrier in the first oxide layer and the hydrogen diffusion barrier in the second oxide layer enclose the capacitor.

3. The method according to claim 1, which comprises providing nitrogen as the barrier substance.

4. The method according to claim 1, which comprises:
   prior to performing the step of doping the first oxide layer, applying a mask on the first oxide layer for patterning the doping in the first oxide layer; and
   subsequently, performing an oxide etching step.

5. The method according to claim 4, which comprises:
   producing a contact hole having walls during the oxide etching step; and
   with a plasma doping method, doping the walls of the contact hole with a barrier substance.

6. The method according to claim 1, which comprises: using plasma immersion ion implantation as the plasma doping method.

7. The method according to claim 1, which comprises: using PLAD as the plasma doping method.

8. The method according to claim 1, which comprises: while performing the plasma doping method, providing a barrier substance dose in a range from $10^{19}$ to $10^{22}$ atoms/cm$^2$.

9. The method according to claim 1, which comprises: performing the plasma doping method with a barrier substance implantation energy in the range from 1 to 12 keV.

10. A method for fabricating a semiconductor component, which comprises:
    providing a substrate;
    producing a first insulation layer above the substrate;
    producing a capacitor above the first insulation layer;
    producing the capacitor to include a bottom electrode, a top electrode, and a metal-oxide-containing capacitor material layer deposited between the bottom electrode and the top electrode;
    producing an oxide layer above the capacitor; and
    with a plasma doping method, doping the oxide layer above the capacitor with a barrier substance to form a hydrogen diffusion barrier in the oxide layer.

11. The method according to claim 10, which comprises:
    providing the first insulation layer as a first oxide layer;
    defining the oxide layer above the capacitor as a second oxide layer;
    with a plasma doping method, doping the first oxide layer with a barrier substance to form a hydrogen diffusion barrier in the first oxide layer; and
    ensuring that the hydrogen diffusion barrier in the first oxide layer and the hydrogen diffusion barrier in the second oxide layer enclose the capacitor.

12. The method according to claim 10, which comprises providing nitrogen as the barrier substance.

13. The method according to claim 10, which comprises:
prior to performing the step of doping the oxide layer above the capacitor, applying a mask on the oxide layer above the capacitor for patterning the doping in the oxide layer; and
subsequently, performing an oxide etching step.

14. The method according to claim 13, which comprises:
producing a contact hole having walls during the oxide etching step; and
with a plasma doping method, doping the walls of the contact hole with a barrier substance.

15. The method according to claim 10, which comprises: using plasma immersion ion implantation as the plasma doping method.

16. The method according to claim 10, which comprises: using PLAD as the plasma doping method.

17. The method according to claim 10, which comprises: while performing the plasma doping method, providing a barrier substance dose in a range from $10^{19}$ to $10^{22}$ atoms/cm$^2$.

18. The method according to claim 10, which comprises: performing plasma doping method with a barrier substance implantation energy in the range from 1 to 12 keV.

* * * * *